United States Patent

Yoshioka et al.

[11] Patent Number: 5,464,713
[45] Date of Patent: Nov. 7, 1995

[54] PHASE SHIFT MASK AND METHOD FOR REPAIRING A DEFECT OF A PHASE SHIFT MASK

[75] Inventors: Nobuyuki Yoshioka; Kunihiro Hosono; Junji Miyazaki, all of Hyogo, Japan

[73] Assignees: Mitsubishi Denki Kabushiki Kaisha; Dainippon Printing Co., Ltd., both of Tokyo, Japan

[21] Appl. No.: 309,832

[22] Filed: Sep. 21, 1994

[30] Foreign Application Priority Data

Sep. 24, 1993 [JP] Japan .................................. 5-238251
Aug. 26, 1994 [JP] Japan .................................. 6-202187

[51] Int. Cl.⁶ ............................................ G03F 9/00
[52] U.S. Cl. .............................. 430/5; 430/321; 430/323; 216/48; G03F/9/00
[58] Field of Search ........................ 430/5, 321, 323; 156/646

[56] References Cited

U.S. PATENT DOCUMENTS 4,890,309 12/1989 Smith et al. ............................ 378/35
5,382,484 1/1995 Hosono ................................. 430/321

FOREIGN PATENT DOCUMENTS 57-62052   4/1982  Japan .
58-173744 10/1983  Japan .
4-136854   5/1992  Japan .
4-335523  11/1992  Japan .

Primary Examiner—S. Rosasco
Attorney, Agent, or Firm—Lowe, Price, Leblanc & Becker

[57] ABSTRACT

In a phase shift mask and a method for repairing a defect of a phase shift mask according to the present invention, a phase shifter defective portion in which a portion of a phase shifter portion is missing is formed in a region including a boundary between a light transmitting portion and a phase shifter portion, and phase shifter defective portion is supplemented with a repairing member having substantially the same transmittance as that of phase shifter portion and capable of converting a phase of exposure light by 180°. Thus, a defect of the phase shifter portion generated on or in the vicinity of the boundary between the light transmitting portion and the phase shifter portion can be repaired without impairing a function as a phase shift mask.

15 Claims, 19 Drawing Sheets

DISTANCE FROM CENTRAL POINT 0

(a)

(b) ELECTRIC FIELD ON PHASE SHIFT MASK (c) LIGHT AMPLITUDE ON RESIST FILM (d) LIGHT INTENSITY ON RESIST FILM (e) TRANSFERRED PATTERN

PHASE SHIFT MASK AND METHOD FOR REPAIRING A DEFECT OF A PHASE SHIFT MASK

BACKGROUND OF THE INVENTION

1. Field of the Invention

The present invention relates to a phase shift mask and a method for repairing a defect of a phase shift mask, and in particular, it is concerned with a phase shift mask and a method for repairing a defect of a phase shift mask in which a defective portion of a phase shifter is generated in the vicinity of a boundary between a light transmitting portion and a phase shifter portion.

2. Description of the Background Art

Recently, high integration and miniaturization have been greatly developed in semiconductor integrated circuits. Accordingly, miniaturization of circuit patterns formed on a semiconductor substrate has been developed rapidly.

A photolithography technique is, among others, well known in the art as a basic technique for pattern formation, for which various developments and improvements have been made. However, there is still an increasing need for miniaturization of a pattern, and thus, there is a stronger need for improvement in resolution of a pattern.

In general, a resolution limit R (nm) in the photolithography technique using a demagnification exposure method is expressed as $$R = k_1 \cdot \lambda/(NA) \quad (1)$$

where $\lambda$ represents a wavelength (nm) of light, NA represents a numerical aperture of a lens, and $k_1$ is a constant depending on a resist process.

As can be seen from the above expression, in order to improve a resolution limit, values of $k_1$ and $\lambda$ are made smaller and a value of NA is made larger. In other words, it is sufficient to reduce the constant depending on the resist process, with the wavelength being made shorter and NA being increased.

Nevertheless, it is difficult technically to improve a light source or a lens, and there is generated such a problem as to incur degradation of a resolution, because a depth of focus $\delta$ of light ($\delta = k_2 \cdot \lambda/(NA)^2$) is made shallower by shortening the wavelength and increasing NA.

Now, with reference to FIG. 24, a description will be made for a cross section of a conventional photomask, an electric field on the photomask, a light intensity on the resist film, and a pattern transferred onto the resist film.

First, with reference to FIG. 24(a), a structure of a photomask 30 will be described. In photomask 30, a mask pattern 38 having a predetermined shape is formed on a transparent glass substrate 32. This mask pattern 38 includes a light shielding portion 34 formed of chromium or the like and a light transmitting portion 36 exposing transparent glass substrate 32.

With reference to FIG. 24(b), the electric field of exposure light of photomask 30 is provided along the photomask pattern.

With reference to FIG. 24(c), the light intensity on a semiconductor wafer will be described. When a fine pattern is to be transferred, beams of exposure light transmitted through the photomask are intensified by each other due to diffraction and interference in a portion of adjacent pattern images where beams of light are overlapped.

Therefore, a difference in the light intensity on the semiconductor wafer is reduced, so that a resolution is deteriorated. As a result, a pattern transferred on the resist film is, as shown in FIG. 24(d), cannot reflect the photomask pattern accurately.

In order to solve this problem, a phase shift exposure method using a phase shift mask, for example, has been proposed in Japanese Patent Laying-Open Nos. 57-62052 and 58-173744.

Now, with reference to FIG. 25, a phase shift exposure method using a phase shift mask disclosed in Japanese Patent Laying-Open No. 58-173744 will be described.

FIG. 25(a) is a cross sectional view of a phase shift mask 40. FIG. 25(b) shows an electric field on the photomask. FIG. 25(c) shows an amplitude of light on the resist film. FIG. 25(d) shows light intensity on the resist film. FIG. 25(e) shows a pattern transferred onto the resist film.

First, with reference to FIG. 25(a), a structure of phase shift mask 40 will be described. A mask pattern 50 having a predetermined shape is formed on a transparent glass substrate 42. This mask pattern 50 includes a light shielding portion 44 formed of chromium or the like and a light transmitting portion 46 exposing transparent glass substrate 42. At every other light transmitting portion 46 exposing transparent glass substrate 42 is provided a phase shifter portion 48 formed of a transparent insulating film such as a silicon oxide film.

With reference to FIG. 25(b), in the electric field on the photomask formed by beams of light transmitted through phase shift mask 40, the transmitted beams of light have phases inverted alternately by 180°. Therefore, in adjacent pattern images, overlapping beams of exposure light transmitted through phase shift mask 40 have phases inverted from each other.

Accordingly, the amplitude of light on the resist film is provided as shown in FIG. 25(c). As to the light intensity on the resist film, beams of light are canceled with each other due to interference in a portion where beams of light are overlapped, as shown in FIG. 25(d). As a result, there is provided a sufficient difference in the light intensity of exposure light on the resist film allowing improvement of the resolution, so that the pattern along mask pattern 50 can be transferred onto the resist film as shown in FIG. 25(e).

However, although the phase shift exposure method using the above-described phase shift mask is highly effective in a periodic pattern such as lines and spaces, arrangement of phase shifters and the like becomes very difficult in the case of a complex pattern, so that a pattern cannot be set arbitrarily.

As a phase shift mask for solving this problem, a phase shift mask of attenuation type, for example, has been disclosed in JJAP Series 5 Proceedings of 1991 International MicroProcess Conference pp. 3–9 and Japanese Patent Laying-Open No. 4-136854.

A phase shift mask of attenuation type disclosed in Japanese Patent Laying-Open No. 4-136854 will be described below.

FIG. 26(a) shows a sectional structure of a phase shift mask 52 of attenuation type. FIG. 26(b) shows an electric field on the photomask. FIG. 26(c) shows an amplitude of light on the resist film. FIG. 26(d) shows light intensity on the resist film. FIG. 26(e) shows a pattern transferred onto the resist film.

First, with reference to FIG. 26(a), a structure of the phase shift mask of attenuation type will be described. Phase shift mask 52 includes a transparent quartz substrate 54 and a phase shift pattern 64 having a predetermined pattern shape on transparent quartz substrate 54.

Phase shift pattern 64 includes a light transmitting portion 62 exposing the transparent quartz substrate, and a phase shifter portion 60 formed on transparent quartz substrate 54, which has a smaller transmittance of exposure light than in light transmitting portion 62 and converts a phase of exposure light by 180°.

Phase shifter portion 60 is formed by a chromium layer 56 having a transmittance of 5–40% with respect to the exposure light transmitted through light transmitting portion 62, and a shifter layer 58 converting a phase of the exposure light by 180°.

In the electric field on the photomask of the exposure light transmitted through phase shift mask 52 having the above-described structure, a phase of exposure light is inverted at an edge portion of the exposure pattern, thus providing the amplitude of exposure light on the resist film as shown in FIG. 26(c).

Thus, the light intensity on the resist film is necessarily 0 at the edge portion of exposure pattern, as shown in FIG. 26(d). As a result, there is provided a sufficient difference in the electric field of exposure pattern between light transmitting portion 62 and phase shifter portion 60 so as to obtain a high resolution, whereby the pattern along the phase shift pattern can be transferred onto the resist film as shown in FIG. 26(e).

The applicant of the present invention has developed a phase shift mask for solving a problem in the phase shift mask in Japanese Patent Laying-Open No. 4-335523.

While phase shift mask 52 shown in FIG. 26 includes phase shifter portion 60 having a two-layered structure of chromium layer 56 and shifter layer 58, a phase shift mask 66 shown in FIG. 27 described in Japanese Patent Laying-Open No. 4-335523 includes a phase shifter portion 70 formed of a single material having the same transmittance as that of chromium film 56 and having the same phase angle as in phase shifter portion 60.

More specifically, a phase shift pattern 74 having a predetermined-shaped pattern is formed on a transparent quartz substrate 68 in phase shift mask 66.

Phase shift pattern 74 includes a light transmitting portion 72 exposing transparent quartz substrate 68 and a phase shifter portion 70 formed of a single material. A material of phase shifter portion 70 includes a MoSi nitride oxide film, a MoSi oxide film, a Cr oxide film, a Cr nitride oxide film and a Cr nitride carbide oxide film.

The electric field on the photomask, the amplitude of light on the resist film, light intensity on the resist film, and the transferred pattern on the resist film in the case of using phase shift mask 66 are as shown in FIG. 28(a)–(e). As can be seen from these figures, the same effect can be obtained as in the case of FIG. 26.

Now, a method for repairing a defect when a defect is generated in phase shift pattern 74 of phase shift mask 66 will be described below.

First, with reference to FIG. 29, defects generated in phase shift pattern 74 include a remaining defect (opaque defect) 78 and a pinhole defect (clear defect) 76. In order to inspect such a defect, a die to die inspection system is carried out by using, for example, a light-transmitting pattern defect inspection system (manufactured by KLA, type 239HR). This defect inspection system generally utilizes light emitted from a light source of a mercury lamp.

Through inspection, remaining defect 78 which is a portion of the phase shifter left in a region of phase shift pattern 74 to be etched, and pinhole defect 76 which is a pinhole or a missing portion generated in the phase shifter to be left are detected.

Now, this remaining defect 78 and pinhole defect 76 are repaired. Remaining defect 78 is repaired by a laser blow repairing apparatus using a YAG laser 82, such as is used in the conventional photomask.

Another method for removing the remaining defect is by gas-assist etching using an FIB (Focused Ion Beam).

As to repairing of pinhole defect 76, the pinhole defect is filled with a carbon-type film 80 by FIB assist deposition using an aromatic-type gas, as is generally used in the conventional photomask. The FIB assist deposition can make the process easier and reduce the repairing cost.

Since carbon-type film 80 on the phase shift mask repaired as described above is not peeled off even during cleaning conducted in the later step, a favorable phase shift mask can be obtained.

However, there is a problem in the above-described conventional technique as below.

FIG. 30 is a plan view of a phase shift mask 84 of attenuation type wherein a phase shifter portion 86 and a light transmitting portion 88 are included.

Also, there are provided a pinhole defect 90 generated only in a region of phase shifter portion 86 and a pinhole defect 92 formed in the vicinity of a boundary between light transmitting portion 88 and phase shifter portion 86.

In the following, how these pinhole defects 90 and 92 are repaired will be described. As to pinhole defect 90, carbon-type film 80 is usually used, as shown in FIG. 29.

On the contrary, in the case of repairing of pinhole defect 92, a transmittance of exposure light in this region should be considered.

For example, with reference to FIG. 31, the case where pinhole defect 92 is repaired by filling with carbon-type film 94 by the FIB assist deposition will be discussed.

If exposure is carried out normally by using a phase shift mask including light transmitting portion 88 and phase shifter portion 86 without any pinhole defect 92, then a complete circular pattern 98 is formed in a positive resist film 96 after etching, as shown in FIG. 32. The light intensity of exposure light on the resist film taken along a line A—A and a line B—B are plotted in FIGS. 34 and 35, respectively.

On the contrary, if the phase shift mask in which defects are repaired as shown in FIG. 31 is exposed, an asymmetric pattern 100 is formed in resist film 96, as shown in FIG. 33. The light intensity of the exposure light on the resist film taken along a line C—C and a line D—D are plotted in FIGS. 34 and 35, respectively.

With reference to FIGS. 34 and 35, when the normal resist pattern is formed as shown in FIG. 32, the light intensity on resist film is symmetric about a central axis L, as represented by solid lines a and b. On the contrary, the light intensity on resist film of the pattern shown in FIG. 33 has an oval pattern in which light intensity profile is expanded outwardly as shown by a dotted line c.

The reason for this is that since an opaque carbon-type film is formed in the vicinity of the boundary between the light transmitting portion and the phase shifter portion, such a boundary portion does not serve as a phase shift mask, whereby the same event as is described in photomask 30 shown in FIG. 24 is generated.

Thus, in view of a strong need for miniaturization of a semiconductor apparatus, if a dimensional error is generated in a pattern of the resist film, there are provided disadvantages such as electrical variation in a memory portion of a semiconductor memory device, insufficient contact of bit lines, and short circuit due to insufficient alignment margin.

Also, if a pinhole defect 106 generated in a phase shifter portion 102 of a phase shift pattern formed by lines and spaces of a light transmitting portion 104 and a phase shifter portion 102 is repaired with a carbon-type film 108 as shown in FIG. 36, a portion 114 in which the pattern 110 is thinned is generated as can be seen in pattern 110 of the resist film in FIG. 37.

If an interconnection layer or the like is patterned with such a resist film, the resulting interconnection layer includes a thinner portion. Therefore, disadvantages such as resistance increase and disconnection in that portion are incurred, thus greatly deteriorating the performance of semiconductor device.

SUMMARY OF THE INVENTION

The present invention is made to solve the above-described problems, and an object of the present invention is to provide a phase shift mask and a method for repairing a defect of a phase shift mask which allows repair of a defect generated at a boundary between a light transmitting portion and a phase shift portion of a phase shifter portion without impairing the function as a phase shift mask.

According to one aspect of the present invention, a phase shift mask includes a light transmitting portion exposing a surface of a transparent substrate, and a phase shifter portion formed on the transparent substrate, which has a smaller transmittance of exposure light than in the light transmitting portion and converts a phase of exposure light by 180°, wherein a phase shifter defective portion in which a portion of the phase shifter portion is missing is provided in a region including a boundary between the light transmitting portion and the phase shifter portion, and a repairing member having approximately the same transmittance and phase angle as those of the phase shifter portion is arranged in the phase shifter defective portion.

Preferably, a phase angle of the repairing member is 120°–240°. More preferably, a transmittance of the repairing member is 4%–15%. More preferably, the repairing member is formed of the same material as in the phase shifter portion. More preferably, the repairing member is a kind of material selected from the group consisting of a metal oxide, a metal nitride oxide, a metal silicide oxide and a nitride oxide of metal silicide.

More preferably, the repairing member is a kind of material selected from the group consisting of a carbon, a chromium oxide, a chromium nitride oxide, a nitride carbide oxide of chromium, a molybdenum silicide oxide, and a nitride oxide of molybdenum silicide.

More preferably, the repairing member includes a first repairing film having approximately the same transmittance as in the phase shifter portion and a second repairing film having approximately the same phase angle difference as in the phase shifter portion.

According to one aspect of the present invention, a method for repairing a defect of a phase shift mask including a light transmitting portion exposing a surface of a transparent substrate, and a phase shifter portion formed on the transparent substrate, which has a smaller transmittance than in the light transmitting portion and converts a phase of exposure light by 180°, includes the steps of forming a phase shifter defective portion in which a portion of the phase shifter portion is missing in a region including a boundary between the light transmitting portion and the phase shifter portion, and supplementing the phase shifter defective portion with a repairing member having approximately the same transmittance and phase angle as in the phase shifter defective portion.

According to the phase shifter mask and the method for repairing a defect of the phase shifter mask, an identical optical characteristic can be obtained in a region of the phase shifter defective portion where the repairing member is supplemented and in the phase shifter portion. Therefore, the same phase shift mask effect can be obtained even by the exposure light transmitted through the repaired region of phase shifter defective portion. As a result, even with the phase shift mask having the phase shifter defective portion repaired, exposure can be carried out with high accuracy as in the case of using the phase shift mask having no defect.

According to another aspect of the present invention, a phase shift mask includes a light transmitting portion exposing a surface of a transparent substrate, and a phase shifter portion formed on the transparent substrate, which has a smaller transmittance of exposure light than in the light transmitting portion and converts a phase of exposure light by 180°, wherein a phase shifter defective portion in which a portion of the phase shifter portion is missing is provided in a region including a boundary between the light transmitting portion and the phase shifter portion, and a light shielding film is provided at the phase shifter defective portion and at a region protruding to the light transmitting portion for a predetermined length from a boundary between the light transmitting portion and the phase shifter portion included in the phase shifter defective portion.

According to another aspect of the present invention, a method for repairing a defect of a phase shifting mask including a light transmitting portion exposing a surface of a transparent substrate, and a phase shifter portion formed on the transparent substrate, which has a smaller transmittance of exposure light than in the light transmitting portion and converts a phase of exposure light by 180°, includes the steps of forming a phase shifter defective portion in which a portion of the phase shifter portion is missing in a region including a boundary between the light transmitting portion and the phase shifter portion, and forming a light shielding film at the phase shifter defective portion and at a region protruding to the light transmitting portion for a predetermined length from a boundary between the light transmitting portion and the phase shifter portion included in the phase shifter defective portion.

In the phase shifter mask and the method for repairing a defect of the phase shifter mask according to another aspect of the present invention, since the light shielding film is formed protruding to the light transmitting region for a predetermined length, expansion due to diffraction of exposure light transmitted through the interface region between the light transmitting portion and the light shielding film is moved inwardly by the length protruding to the light transmitting region.

Therefore, expansion of light is substantially suppressed, whereby an exposure pattern having a predetermined shape corresponding to the shape of light transmitting portion can be formed. Thus, even with the phase shift mask having the phase shifter defective portion repaired, exposure can be carried out with high accuracy as in the case of the phase shift mask having no defect.

According to still another aspect of the present invention, a method for repairing a defect of a phase shift mask includes the following steps.

First, a phase shift pattern including a light transmitting portion exposing a surface of a transparent substrate, and a phase shifter portion having a smaller transmittance of exposure light than in the light transmitting portion and converting a phase of exposure light by 180° is formed on the transparent substrate.

Then, a resist film is formed on the entire surface of the phase shift pattern. The resist film formed on and in the vicinity of a region including a boundary between the light transmitting portion and the phase shifter portion included in a phase shifter defective portion in which a portion of the phase shifter is missing is then removed.

Then, a repairing film having approximately the same transmittance and phase angle as in the phase shifter portion is formed on the phase shift pattern. Then, the resist film is removed by etching, so that the repairing film is left in the phase shifter defective portion.

According to this method for repairing a defect of the phase shift mask, the repairing film can be formed accurately at the phase shifter defective portion where repairs are required.

As a result, by using the phase shifter mask in which the phase shifter defective portion is repaired as described above, exposure can be carried out with high accuracy as in the case of using the phase shift mask having no defect.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
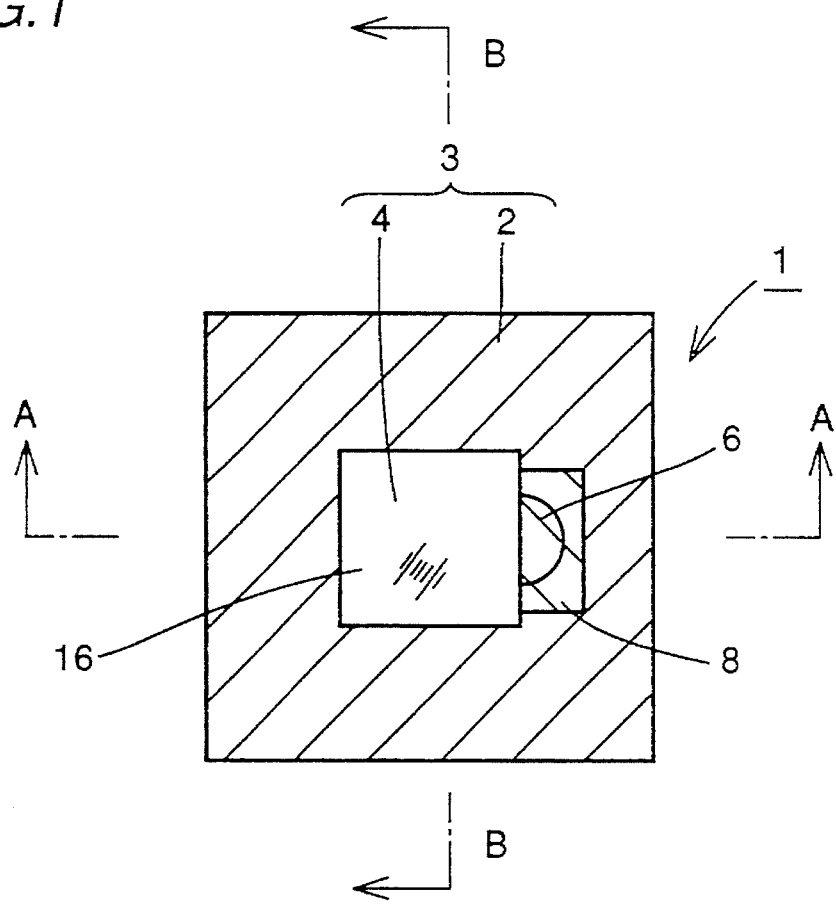
FIG. 1 is a plan view showing a phase shift mask and a method for repairing a defect of a phase shift mask according to a first embodiment of the present invention.

Now, a first embodiment according to the present invention will be described with reference to FIGS. 1 and 2.

Shown in these figures is a phase shift mask 1 of attenuation type including a light transmitting portion 4 exposing a surface of a transparent quartz substrate 16, and a phase shifter portion 2 formed on the transparent substrate, which has a smaller transmittance of exposure light than in light transmitting portion 4 and converts a phase of exposure light by 180°.

Phase shifter portion 2 is formed of a material such as a MoSi nitride oxide film, a MoSi oxide film, a Cr oxide film, a Cr nitride oxide film, a Cr nitride carbide oxide film or the like.

A phase shifter defective portion 6 is supplemented with a repairing member 8 having approximately the same transmittance and phase angle as those of phase shifter 2.

Figure 3:
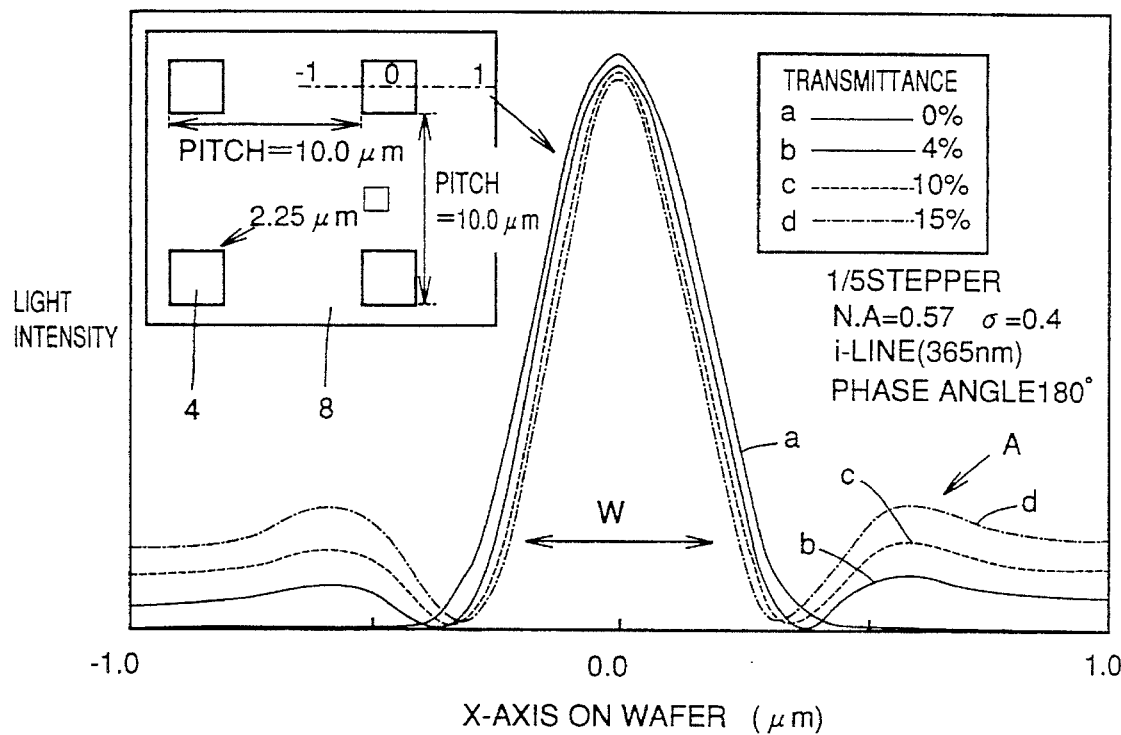
FIG. 3 is a graph showing a relationship between transmittance and profile of light intensity on a resist film repairing member.

Now, ranges of transmittance and phase angles of repairing member 8 are considered. First, with reference to FIG. 3, a relationship between transmittance and light intensity profile of phase shifter 2 will be described. It is noted that the light intensity profile shown in the figure is measured at a phase angle of phase shifter 2 of 180°, using an i-line (365 nm) as exposure light, and at NA=0.57 and σ=0.4 in the phase shift mask wherein light transmitting portions 4 of 2.25 μm☐ are arranged at a pitch of 10.0 μm.

In the figure, a bold line a, a fine line b, a dotted line c, and a dash-dotted line d represent the intensity profiles for repairing member 8 having a transmittance of 0%, 5%, 10%, and 15%, respectively.

As the transmittance of phase shifter 2 increases, a width W at the bottom of the light intensity profile is made narrower. This indicates improvement in resolution. However, the light intensity in both sides of the profile is also increased as the width W becomes narrower. Accordingly, when a transmittance of phase shifter 2 is 15% or more, such a light intensity in both sides of the profile cannot be ignored. Therefore, a preferable transmittance of the repairing member is about 5%–15%.

Figure 4:
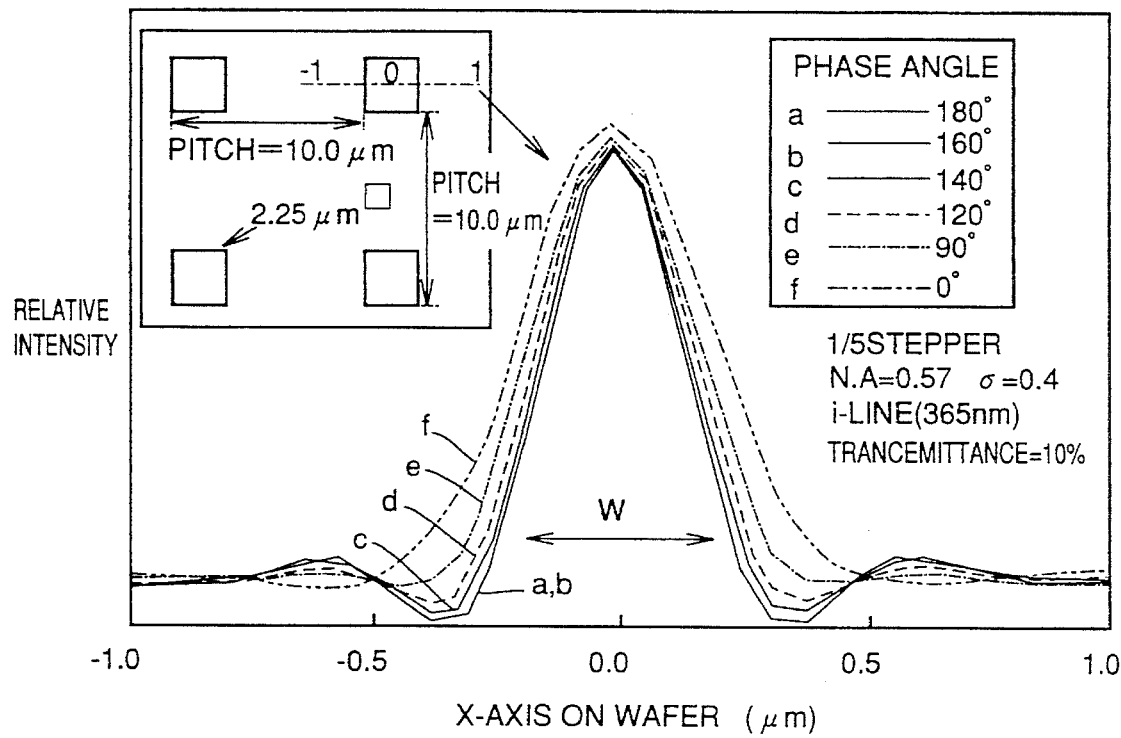
FIG. 4 is a graph showing a relationship between phase angle and profile of light intensity on a resist film member.

Now, with reference to FIG. 4, a relationship between phase angle and light intensity profile of phase shifter 2 will be described. It is noted that the light intensity profile shown in the figure is measured at the transmittance of phase shifter 2 of 10%, using an i-line (365 nm) as exposure light, and at NA=0.57 and σ=0.4 in the phase shifting mask wherein light transmitting portions 4 of 2.25 μm☐ are arranged at a pitch of 10.0 82 m.

In the figure, a bold line a, a solid line b, a fine line c, a dashed line d, a dash-dot line e, and a dash line with two dots f respectively represent phase the intensity profiles for repairing member 8 having a phase angle of 180°, 160°, 140°, 120°, 90° and 0°.

As the phase angle of phase shifter 2 increases, a width W at the bottom of the light intensity profile is made narrower, which indicates improvement in resolution by exposure light. As can be seen from the figure, when the phase angle of phase shifter 2 is in the range of 120°–180°, a preferable profile of light intensity can be obtained. This is true in the case of phase shifter 2 having a phase angle of 180°–240°. Therefore, a preferable phase angle of the repairing member is in the range of 120°–240°.

Figure 5:
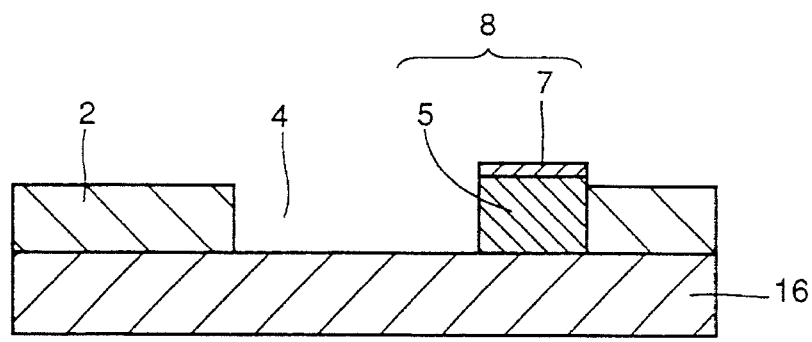
FIG. 5 is a cross sectional view showing a structure of another defect repair taken along line A—A in FIG. 1.

Repairing member 8 may be made of the same material as in phase shifter portion 2. Also, repairing member 8 may be formed by a two-layered structure including a first repairing film 5 made of an opaque material having a predetermined transmittance such as $CrO_x$, $CrO_xN$, MoSiO, MoSiN or the like, or a completely transparent material such as $SiO_2$, and a second repairing film 7 made of a carbon or chromium film formed by FIB assist deposition, as shown in FIG. 5. It is noted that FIG. 5 is a cross sectional view taken along line A—A in FIG. 1.

Phase shift mask 1 in which phase shifter defective portion 6 is repaired as described above has approximately the same transmittance and phase angle as in phase shifter portion 2, whereby the repaired region of the phase shifter defective portion and the phase shifter portion have the identical optical characteristic. Therefore, the same phase shift mask effect can be obtained even with the exposure light transmitted through the repaired region of the phase shifter defective portion.

Figure 2:
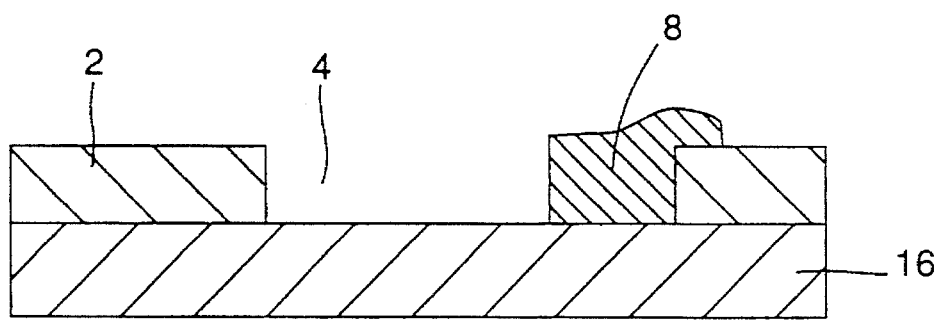
FIG. 2 is a cross sectional view taken along a line A—A in FIG. 1.
Figure 6:
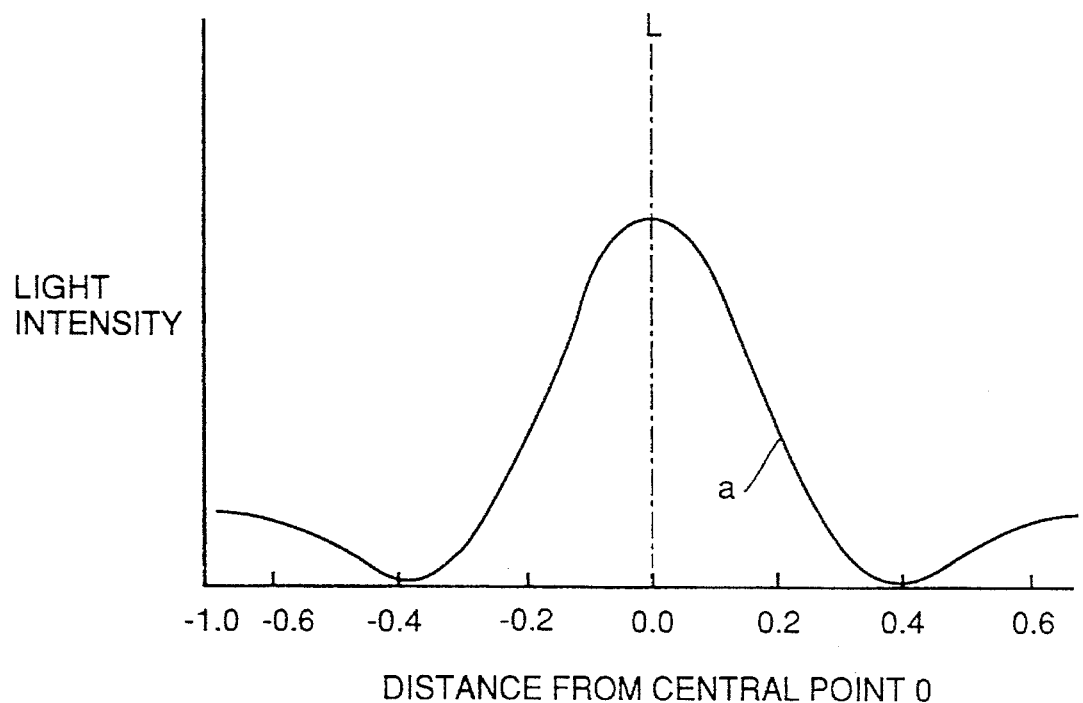
FIG. 6 is a graph showing profile of light intensity of exposure light taken along line A—A in FIG. 1.

Accordingly, the light intensity profile of exposure light in cross sections taken along lines A—A and B—B in FIG. 1 are both symmetrical about central axis L and in a sharp hill-like shape, as shown by solid line a in FIG. 6.

Figure 7:
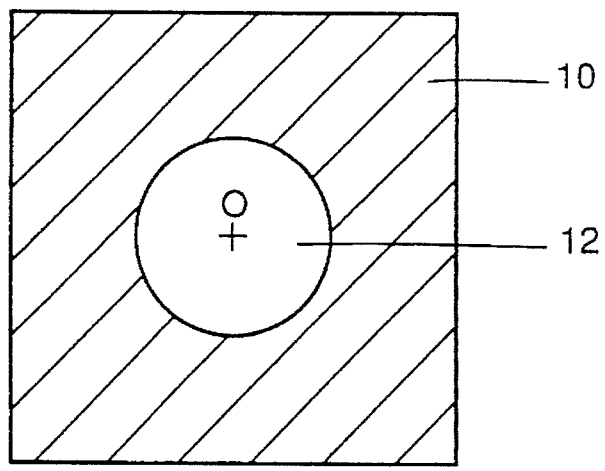
FIG. 7 is a plan view showing a pattern shape formed in a resist film when a phase shift mask shown in FIG. 1 is used.

As a result, when the resist film is exposed with light using the phase shift mask in which the phase shifter defective portion is repaired as described above, a desired resist pattern 12 can be formed in resist film 10, as shown in FIG. 7.

Thus, in the phase shift mask and the method for repairing a defect of a phase shift mask according to the first embodiment, exposure can be carried out with high accuracy as in the case of using the phase shift mask having no defect.

Next, a second embodiment of the present invention will be described with reference to FIG. 8.

Both a structure and a material for a phase shift mask 1 in this embodiment are the same as those in the first embodiment, and a phase shifter defective portion 6 is also generated at the same position as in the first embodiment.

In a method for repairing phase shifter defective portion 6 according to this embodiment, a light shielding film 14 made of a material such as chromium, carbon, molybdenum silicide, tungsten silicide, molybdenum, tantalum, tungsten, silicon or the like is formed at phase shifter defective portion 6 and at a region protruding by a predetermined length (Hi) from a normal boundary between light transmitting portion 4 and phase shifter portion 2 included in phase shifter defective portion 6.

For example, in this embodiment, assuming a diameter of the resist pattern formed in the resist film is about 0.4 μm, a protruding amount ($H_1$) of light shielding film 14 is about 0.1–0.2 μm on resist film 10.

Also, the protruding amount ($H_1$) of light shielding film 14 is about 0.05–0.15 μm on resist film 10 when a diameter of the resist pattern is about 0.35 μm, while the amount ($H_1$) is about 0.05–0.1 μm on resist film 10 when the diameter of the resist pattern is about 0.3 μm.

Figure 8:
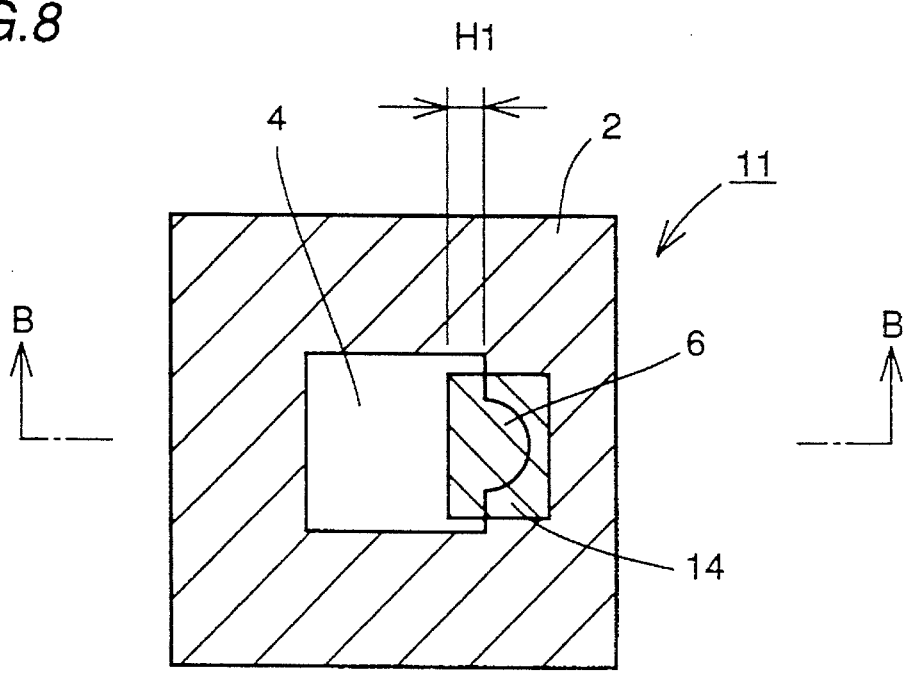
FIG. 8 is a plan view showing a phase shift mask and a method for repairing a defect of a phase shift mask according to a second embodiment of the present invention.
Figure 9:
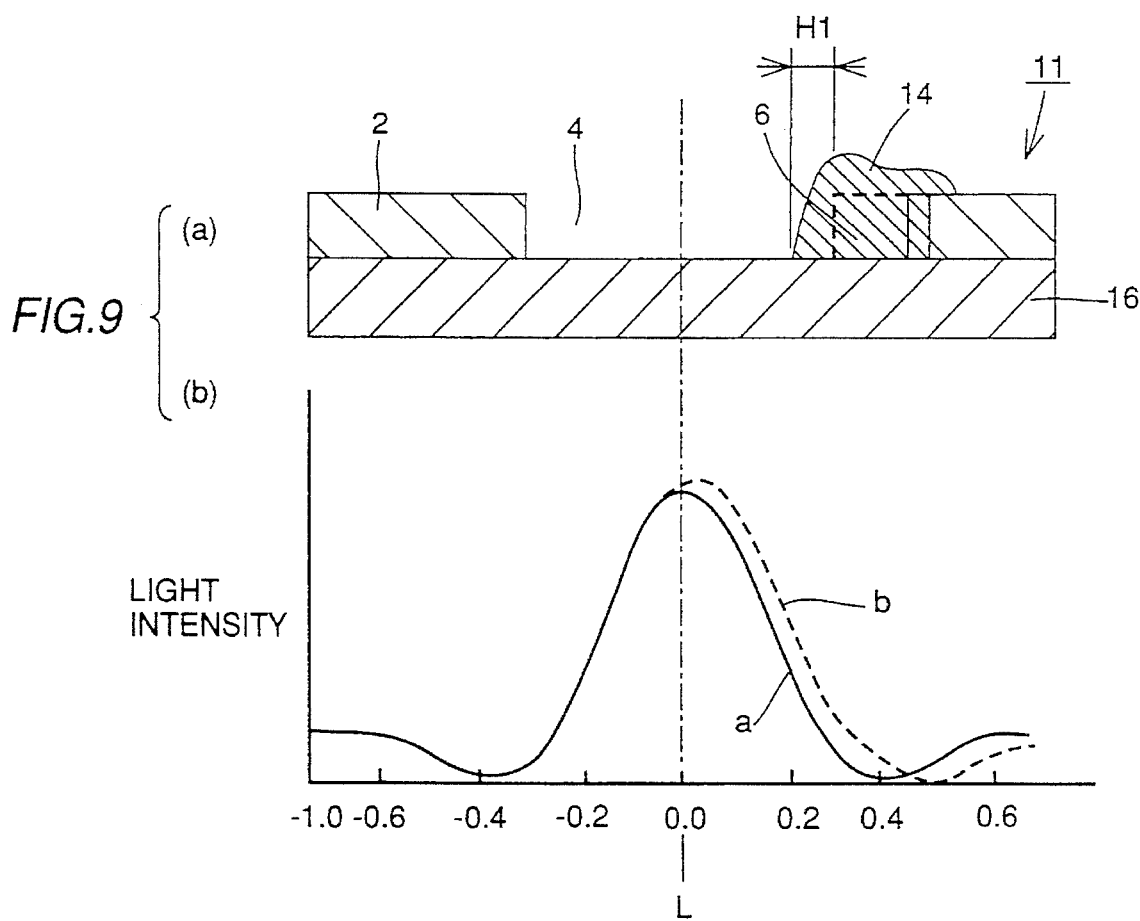
FIG. 9(a) is a cross sectional view taken along a line B—B in FIG. 8.
FIG. 9(b) is a graph showing profile of light intensity taken along line B—B in FIG. 8.

When a phase shifting mask 11 shown in FIG. 8 is used, light intensity profile on the resist film taken along a line B—B is obtained as shown in FIG. 9.

With reference to FIGS. 9(a) and 9(b), light shielding film 14 is formed protruding to light transmitting portion 4 by a predetermined length, light shielding film 14 confines the expansion of the exposure light due to diffraction is moved inwardly as shown by a solid line a. Note that a dashed line b represents the profile of light intensity in the case of $H_1$=0.

Thus, expansion of exposure light can be substantially suppressed and exposure pattern having a normal shape corresponding to a shape of the light transmitting portion can be formed, whereby, also in this embodiment, the light intensity profile which is substantially symmetrical about central axis L and in a sharp hill-like shape can be formed as shown by solid line a.

Figure 10:
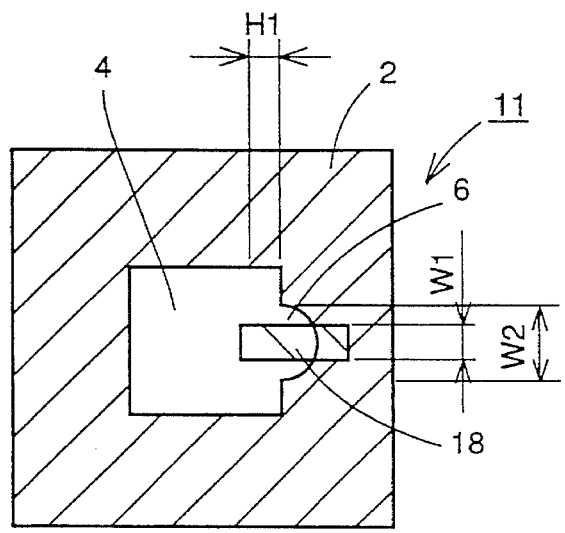
FIG. 10 is a plan view showing a phase shift mask and a method for repairing a defect of a phase shift mask according to a third embodiment of the present invention.

Now, a third embodiment of the present invention will be described with reference to FIG. 10. In this embodiment, a width $W_1$ of light shielding film 18 formed in the phase shifter defective portion is made narrower than a width $W_2$ of the phase shifter defective portion, when compared with the second embodiment shown in FIG. 8. The reason for this is to avoid covering some of the normal phase shifter portion by light shielding film 18. In practice, when $(W_1-W_2)/2 \leq$ about 1 µm, images cannot be formed, thus eliminating any effects on transfer to the resist film.

It is understood in this embodiment that width $W_1$ of light shielding portion 18 can be made thinner to the maximum width required.

It is noted that the light intensity profile shown by solid line a in FIG. 9(b) can be obtained even with the phase shifter mask of this embodiment.

Now, a fourth embodiment of the present invention will be described with reference to FIGS. 11–17.

FIGS. 11–17 show manufacturing steps according to a method for repairing a defect of a phase shift mask of this embodiment.

Figure 11:
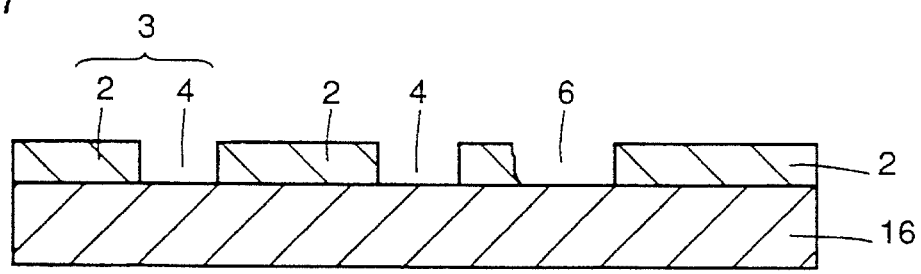
FIGS. 11–17 are cross sectional views showing first through seventh steps of a method for repairing a defect of a phase shift mask according to a fourth embodiment of the present invention.

First, with reference to FIG. 11, a phase shift pattern 3 including a light transmitting portion 4 exposing a surface of a transparent quartz substrate 16 and a phase shifter portion 2 having a smaller transmittance of exposure light than in light transmitting portion 4 and converting a phase of exposure light by 180° is formed on a transparent quartz substrate 16.

At this time, a phase shifter defective portion 6 including a portion of a boundary between phase shifter portion 2 and light transmitting portion 4 is generated in phase shifter portion 2.

Figure 12:
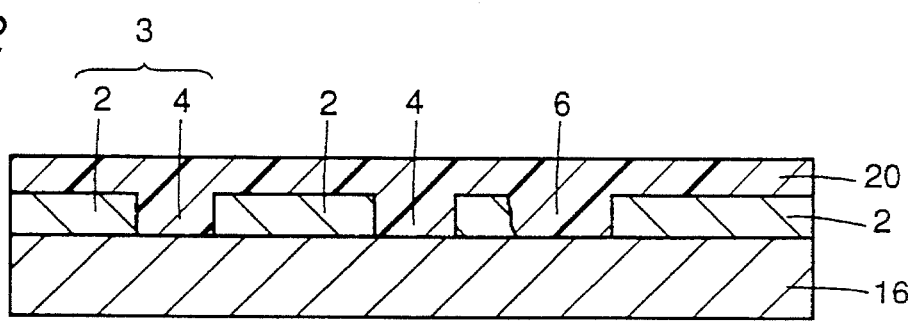
Figure 13:
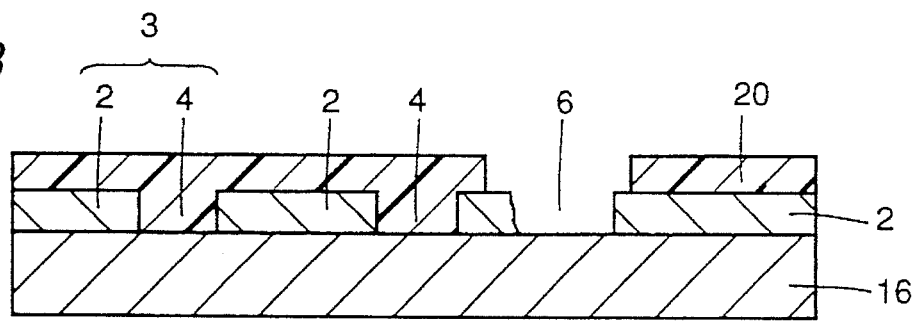

With reference to FIG. 12, a resist film 20 is formed on the entire surface of phase shift pattern 3. Then, with reference to FIG. 13, resist film 20 formed on and in the vicinity of a region of phase shifter defective portion 6 is removed by etching.

Figure 14:
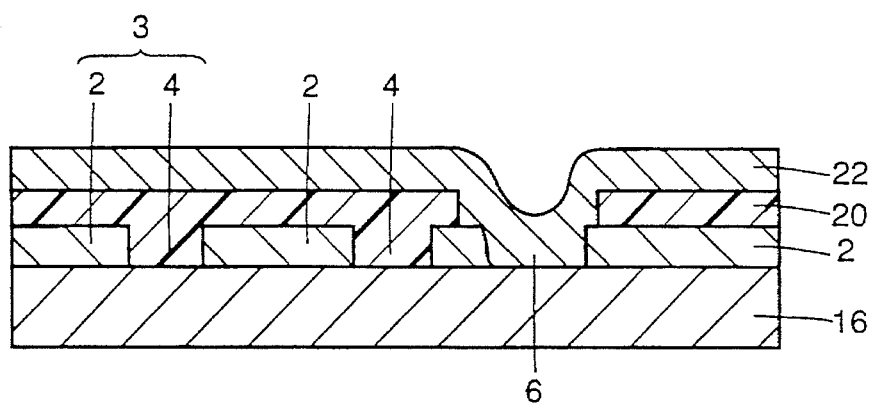

With reference to FIG. 14, a repairing film 22 made of a material such as $CrO_x$, $CrO_xN$, MoSiO, MoSiN or the like which has the same transmittance as that of phase shifter portion 2 and converts a phase of exposure light by 180° is formed on the entire surface of phase shifter pattern 3.

Figure 15:
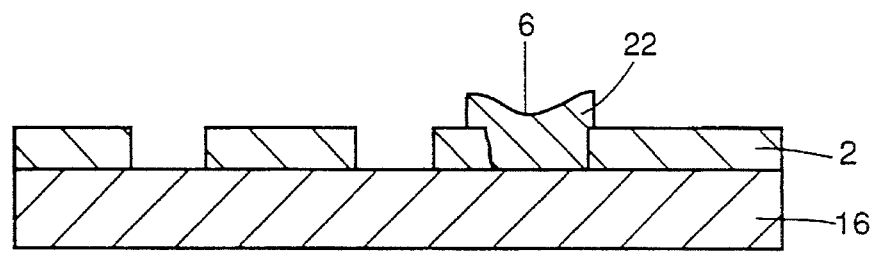

With reference to FIG. 15, resist film 20 is removed by etching, and then, repairing film 22 is left on phase shifter defective portion 6 by a so-called lift-off method.

Figure 16:
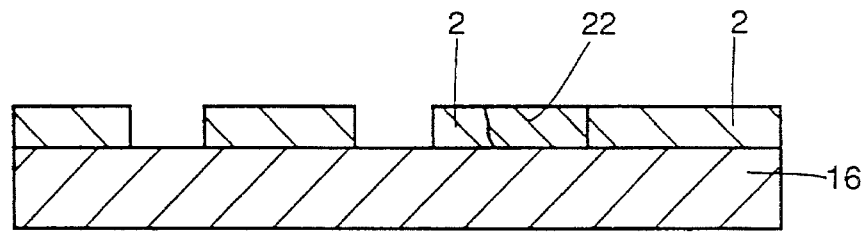

With reference to FIG. 16, repairing film 22 left on phase shifter portion 2 is removed by chemical mechanical etching so as to obtain the identical optical characteristic as in phase shifter portion 4.

Figure 17:
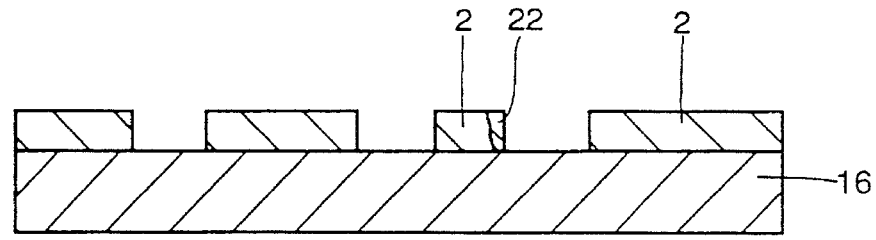

With reference to FIG. 17, repairing film 22 is processed into a predetermined shape by trimming using the FIB. Thus, the method for repairing a defect of a phase shifting mask according to this embodiment is completed.

As described above, in this embodiment, the repairing film is formed in the phase shifter defective portion by a so-called lift-off method, whereby the repairing film can be formed accurately in the phase shifter defective portion which requires repairs.

Now, a fifth embodiment of the present invention will be described with reference to FIGS. 18–21.

Figure 18:
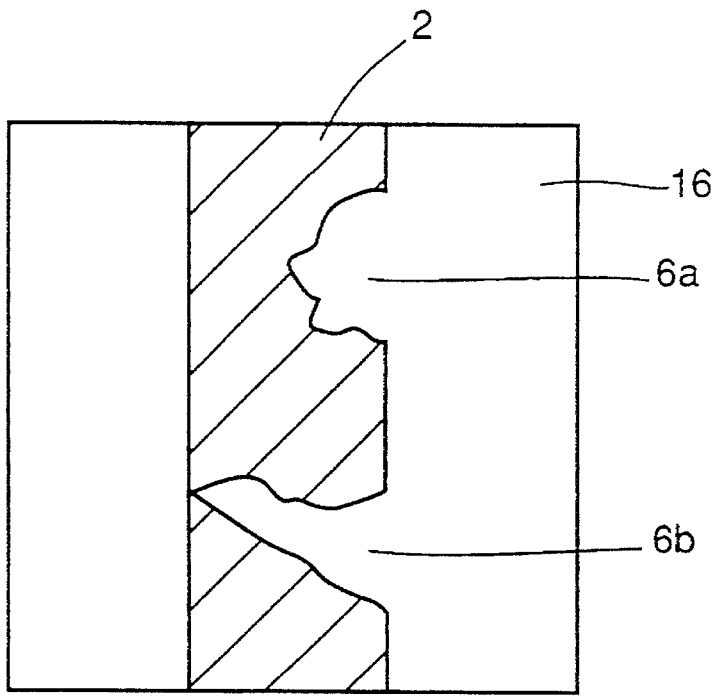
FIGS. 18–20 are plan views showing first through third steps of a method for repairing a defect of a phase shift mask according to a fifth embodiment of the present invention.

As can be seen from FIG. 18, it is likely that phase shifter defective portions 6a and 6b have in general a complex shape. Therefore, it is difficult to repair the phase shifter defective portion along such a complex shape.

Figure 19:
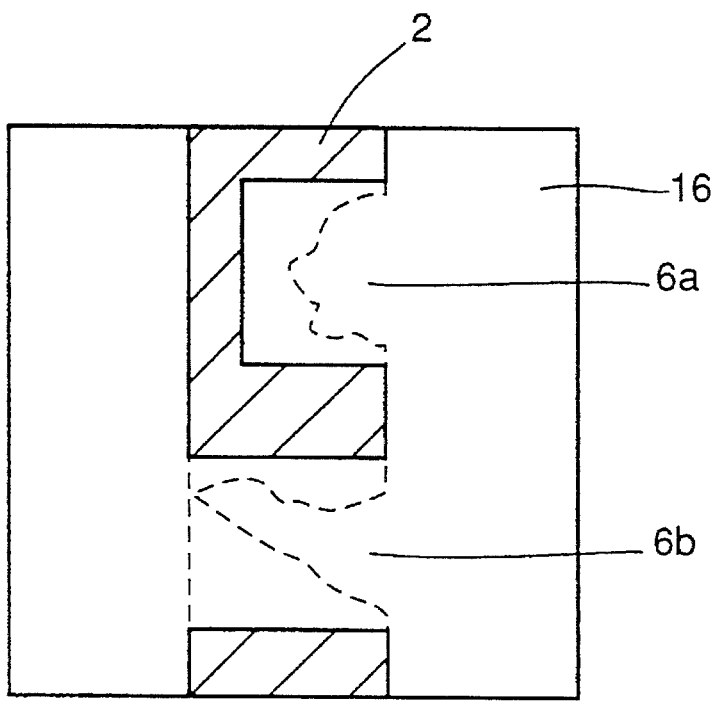
Figure 20:
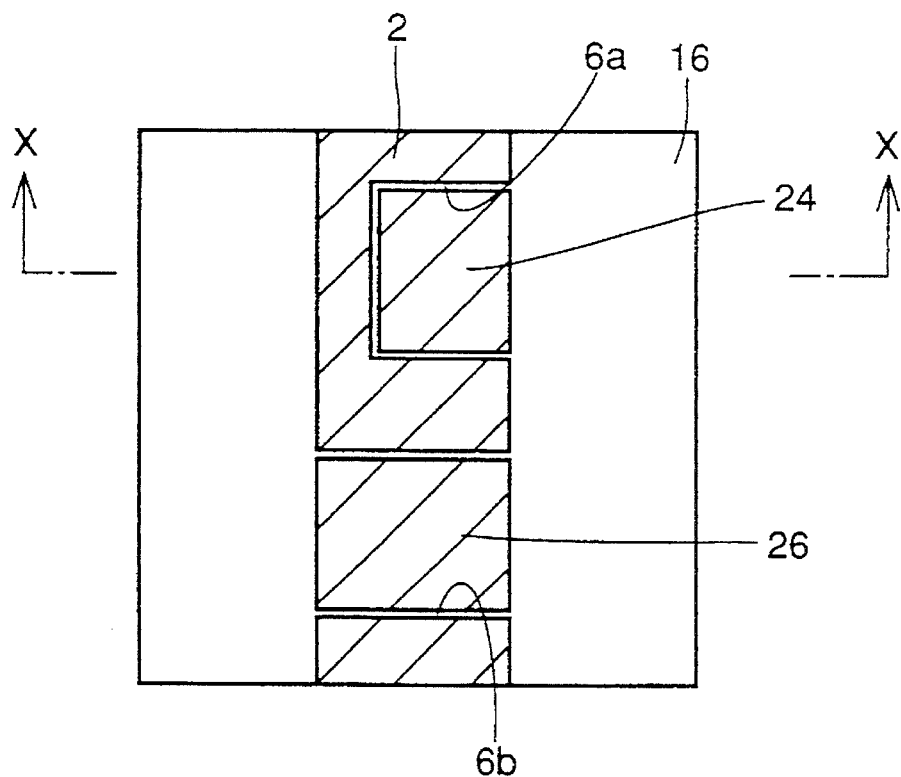
Figure 21:
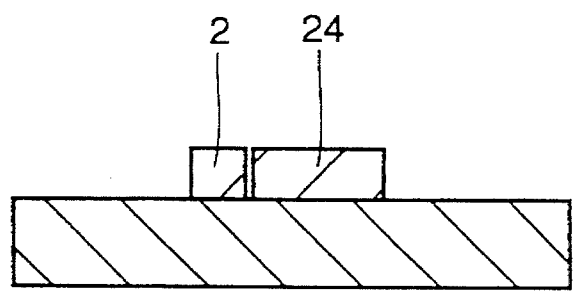
FIG. 21 is a cross sectional view taken along a line X—X in FIG. 20.

Therefore, with reference to FIG. 19, phase shifter defective portions 6a and 6b are processed in advance into a predetermined shape (quadrangle in most cases) in order to facilitate the repair. Then, as can be seen from FIGS. 20 and 21, repairing members 24 and 26 are supplemented to phase shifter defective portions 6a and 6b. Thus, the repair of the phase shifter defective portions can be facilitated.

Figure 22:
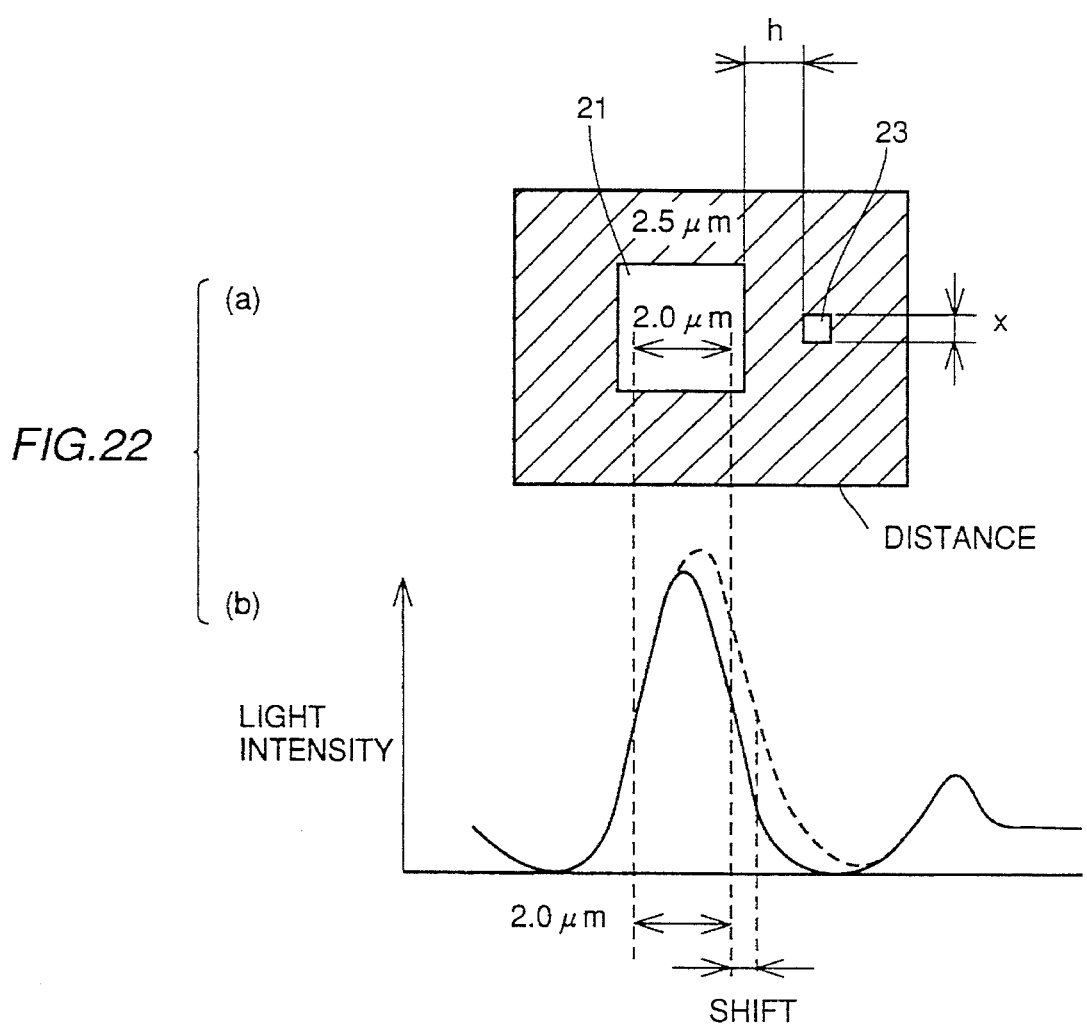
FIG. 22(a) is a plan view showing a relationship between a mask pattern and a defective pattern, and (b) is a graph showing light intensity on a wafer of exposure light transmitted through the mask pattern.

Next, with reference to FIG. 22 and FIG. 23, a positional relationship between a pattern of phase shift mask and a defective pattern will be described.

FIG. 22(a) shows a plan view including a mask pattern 21 having a pattern size of 2.5 µm and a defective pattern 23. FIG. 22(b) is a graph showing light intensity on the wafer of exposure light transmitted through mask pattern 21.

Figure 23:
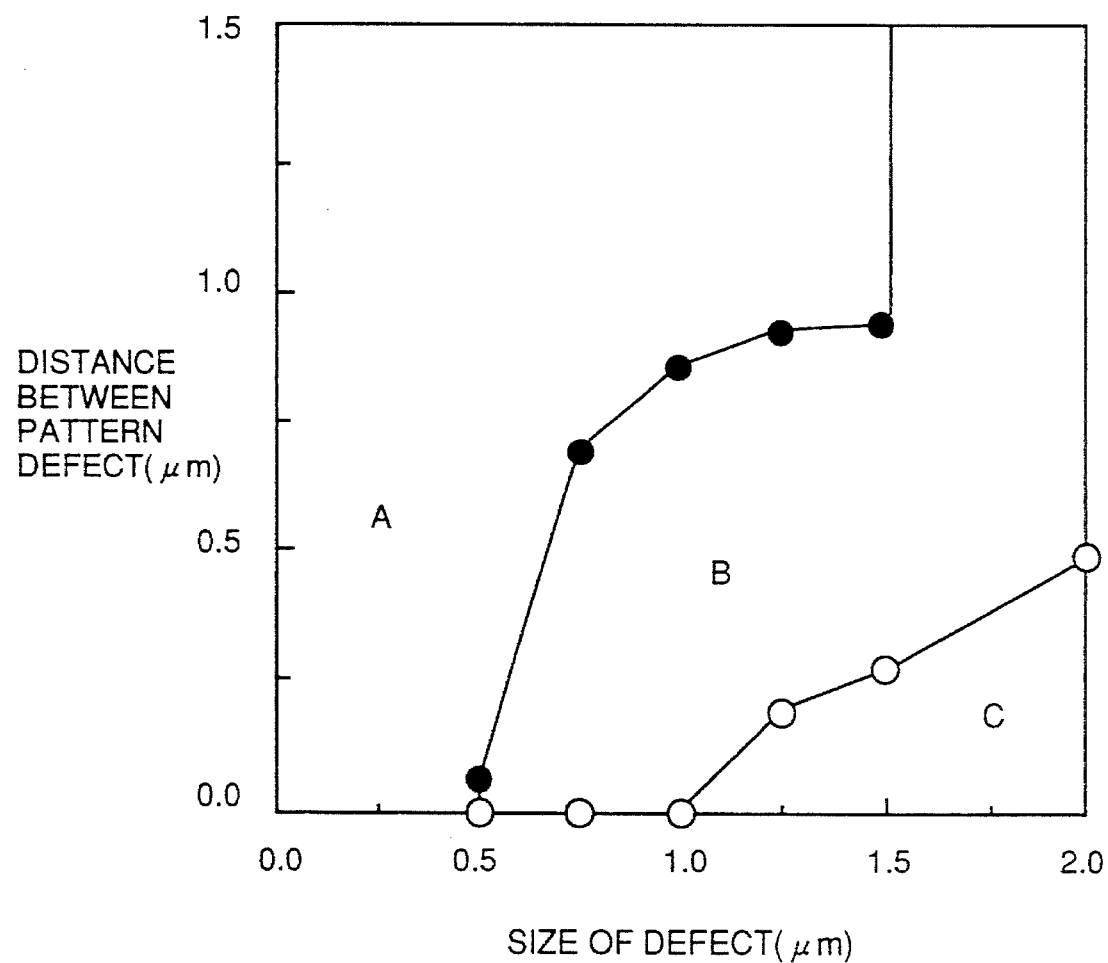
FIG. 23 is a graph showing a relationship between the size of defect and the distance from the mask pattern to the defect.
Figure 24:
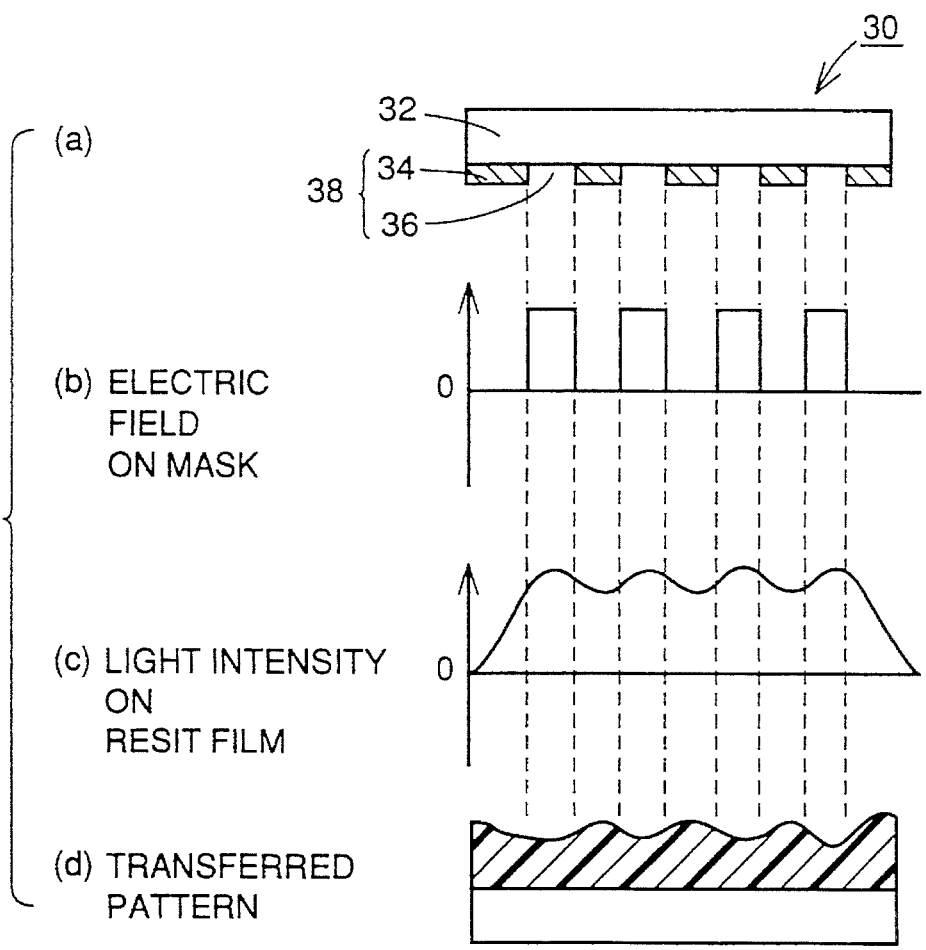
FIG. 24(a) is a cross sectional view of a conventional photomask, (b) is a graph showing an electric field on the photomask when the conventional photomask is used, (c) is a graph showing light intensity on the resist film when the conventional photomask is used, and (d) is a cross sectional view of a pattern transferred onto the resist film when the conventional photomask is used.
Figure 25:
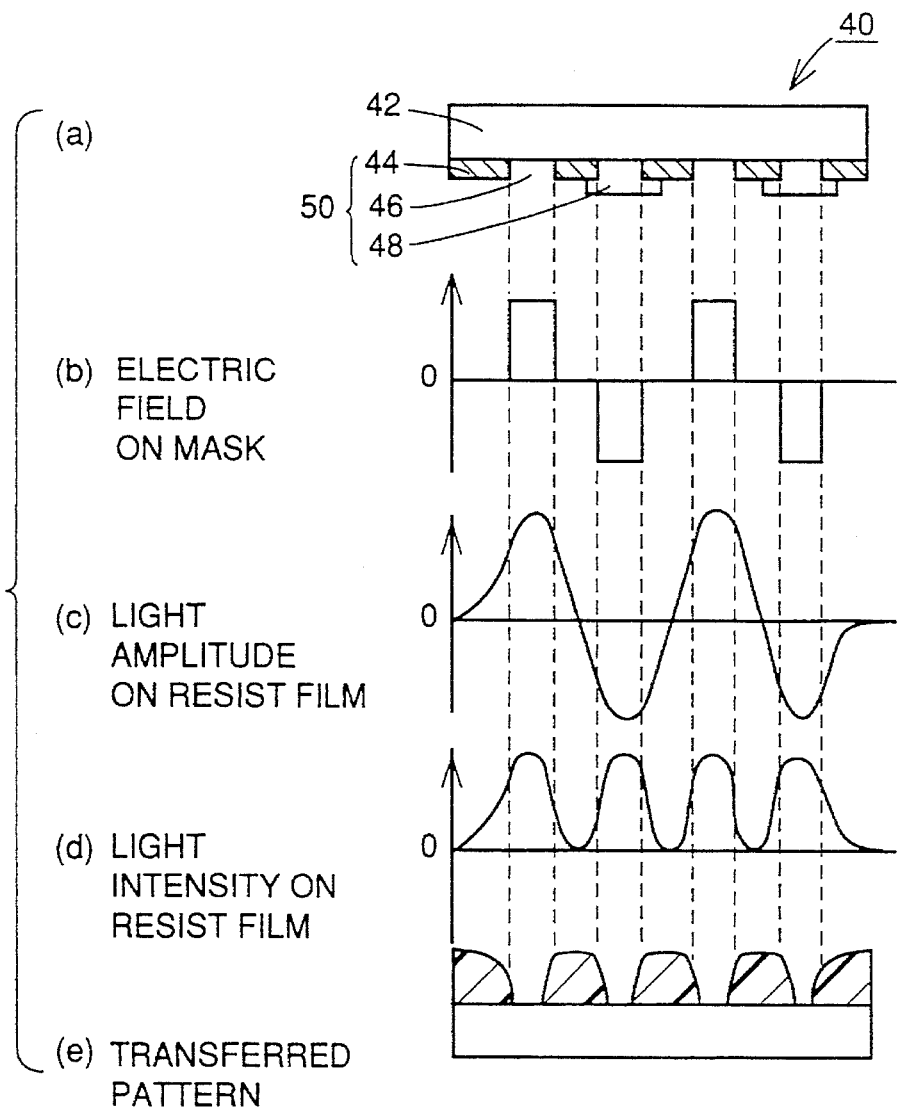
FIG. 25(a) is a cross sectional view of a conventional phase shift mask, (b) is a graph showing an electric field on the photomask when the conventional phase shift mask is used, (c) is a graph showing an amplitude of light on the resist film when the conventional phase shift mask is used, (d) is a graph showing light intensity on the resist film when the conventional phase shift mask is used, and (e) is a cross sectional view of a pattern transferred onto the resist film when the conventional phase shift mask is used.
Figure 26:
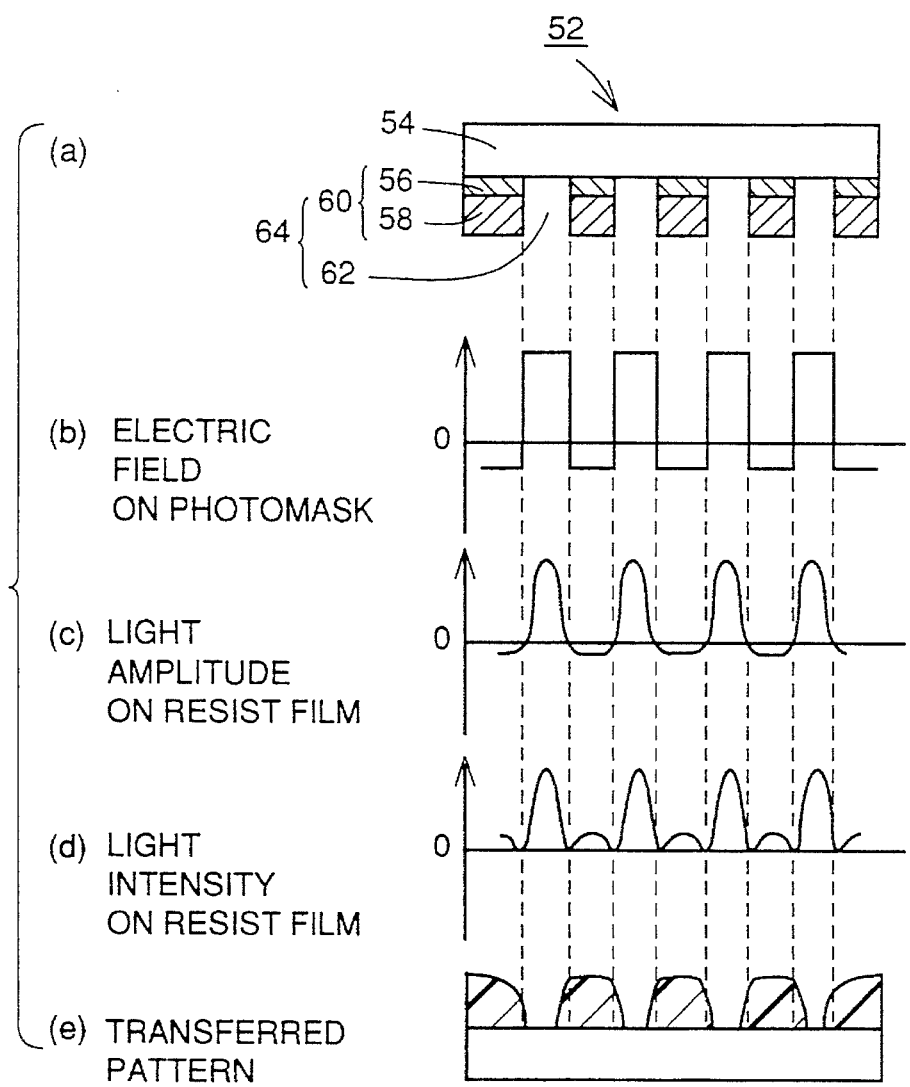
FIG. 26(a) is a cross sectional view of a conventional phase shift mask of attenuation type, (b) is a graph showing an electric field on the photomask when the conventional phase shift mask of attenuation type is used, (c) is a graph showing an amplitude of light on the resist film when the conventional phase shift mask of attenuation type is used, (d) is a graph showing light intensity on the resist film when the conventional phase shift mask of attenuation type is used, and (e) is a cross sectional view showing a pattern transferred onto the resist film when the conventional phase shift mask of attenuation type is used.
Figure 27:
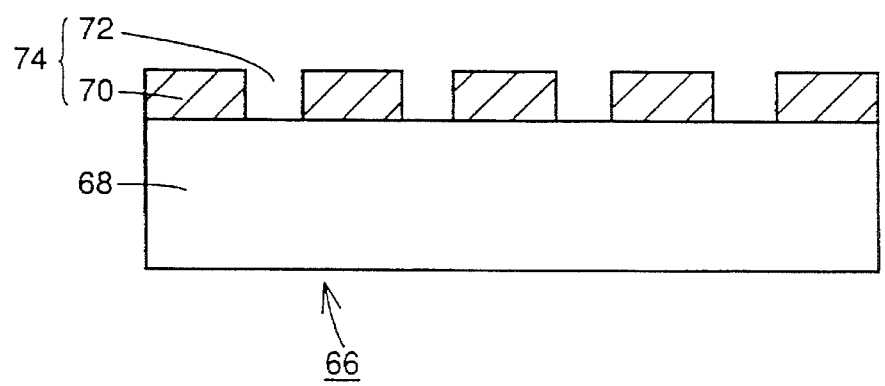
FIG. 27 is a cross sectional view showing a structure of a phase shift mask of attenuation type disclosed in Japanese Patent Laying-Open No. 4-335523.
Figure 28:
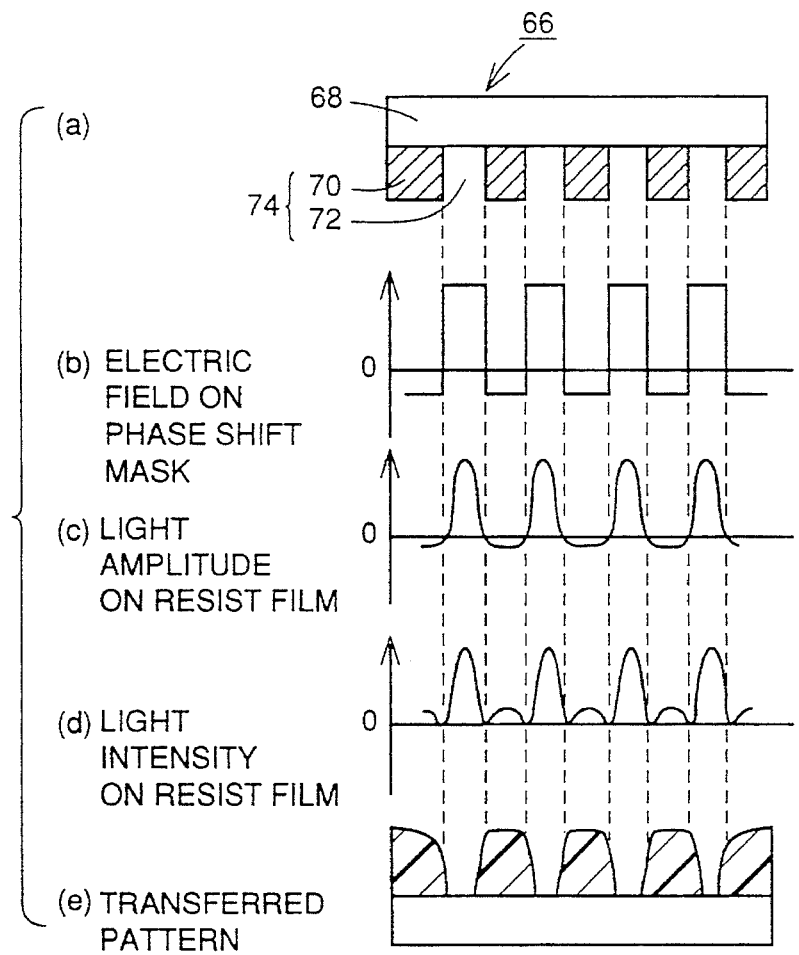
FIG. 28(a) is a cross sectional view of a phase shift mask of attenuation type disclosed in Japanese Patent Laying-Open No. 4-335523, (b) is a graph showing an electric field on the phase shift mask when such a phase shift mask of attenuation type is used, (c) is a graph showing an amplitude of light on the resist film when such a phase shift mask of attenuation type is used, (d) is a graph showing light intensity on the resist film when such a phase shift mask of attenuation type is used, and (e) is a cross sectional view showing a pattern transferred onto the resist film when such a phase shift mask of attenuation type is used.
Figure 29:
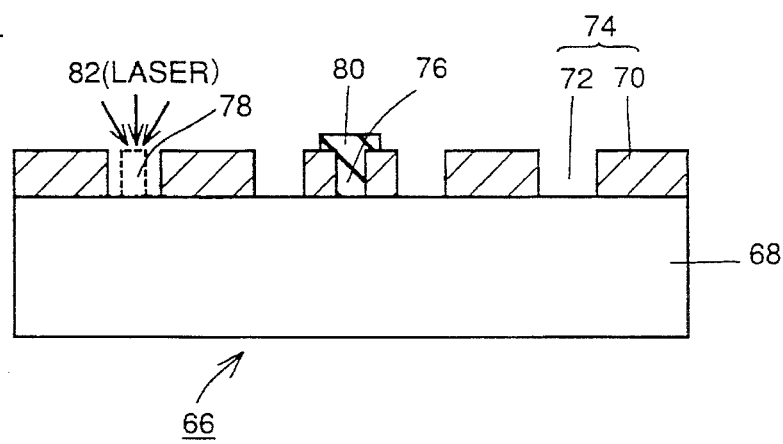
FIG. 29 is a conceptual cross sectional view showing a conventional method for repairing a defect of a phase shift mask.
Figure 30:
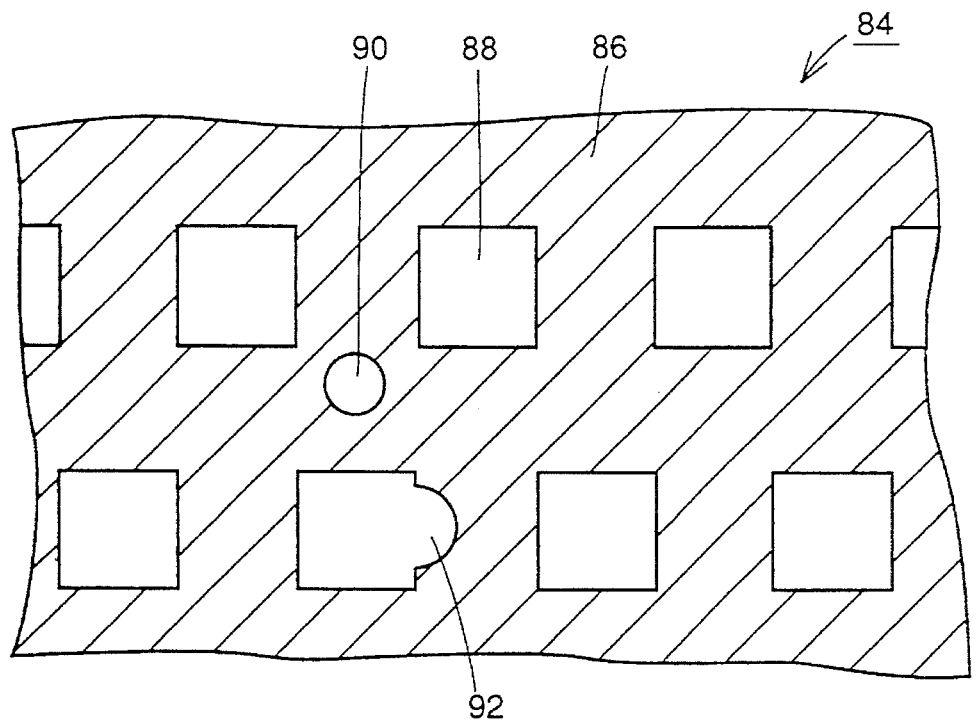
FIGS. 30–33 are first through fourth plan views showing problems in a conventional method for repairing a defect in a phase shift mask.
Figure 31:
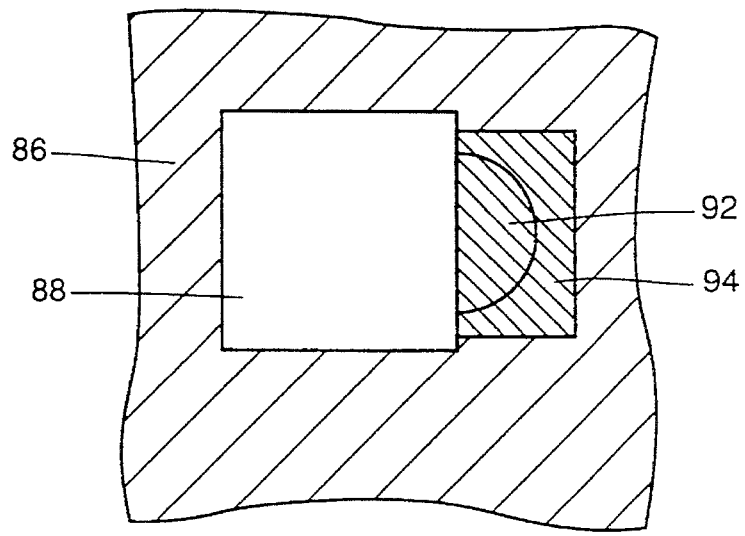
Figure 32:
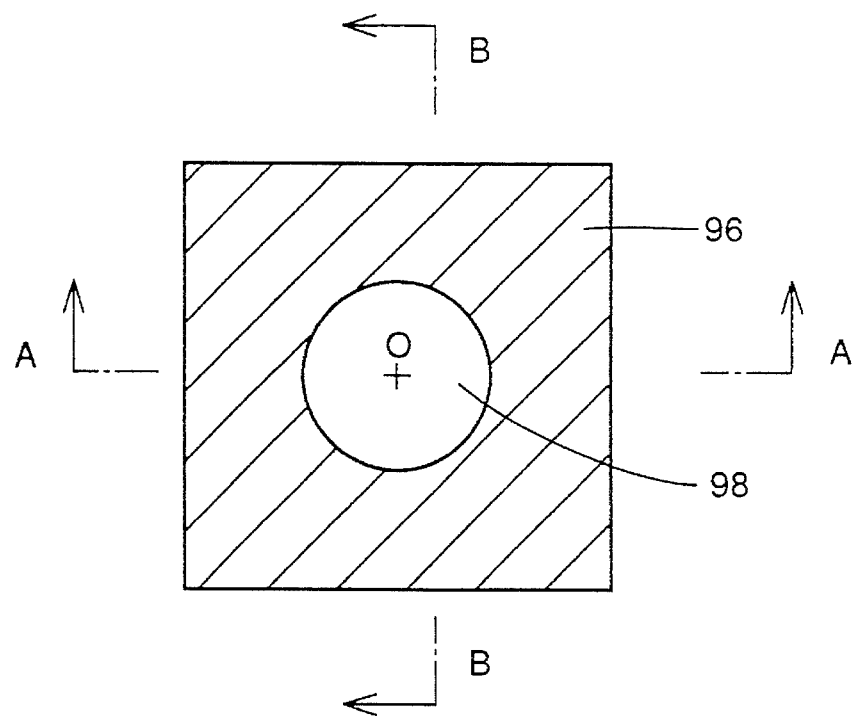
Figure 33:
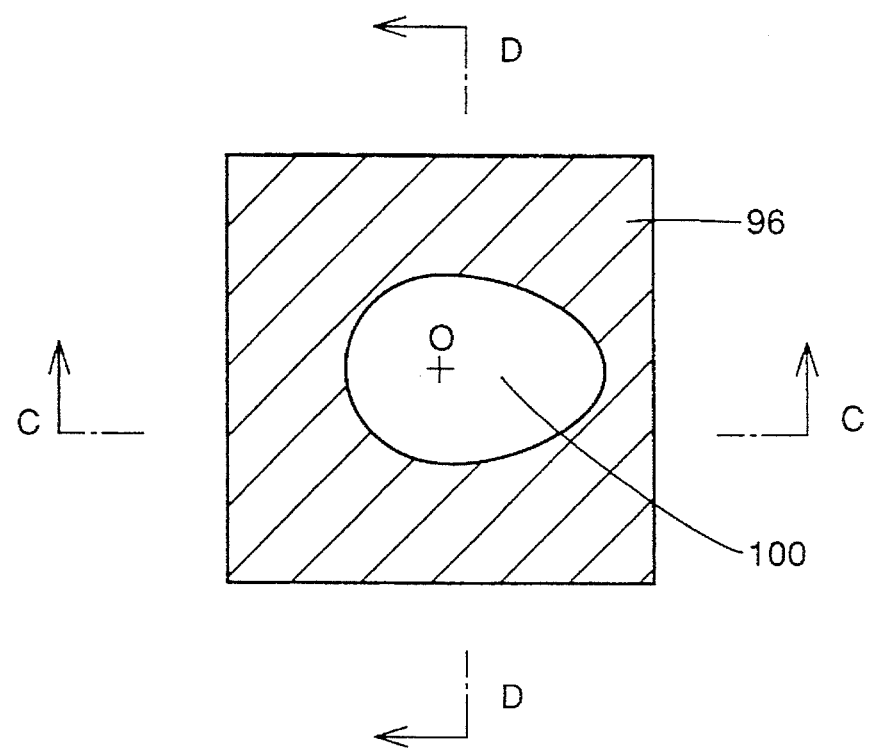
Figure 34:
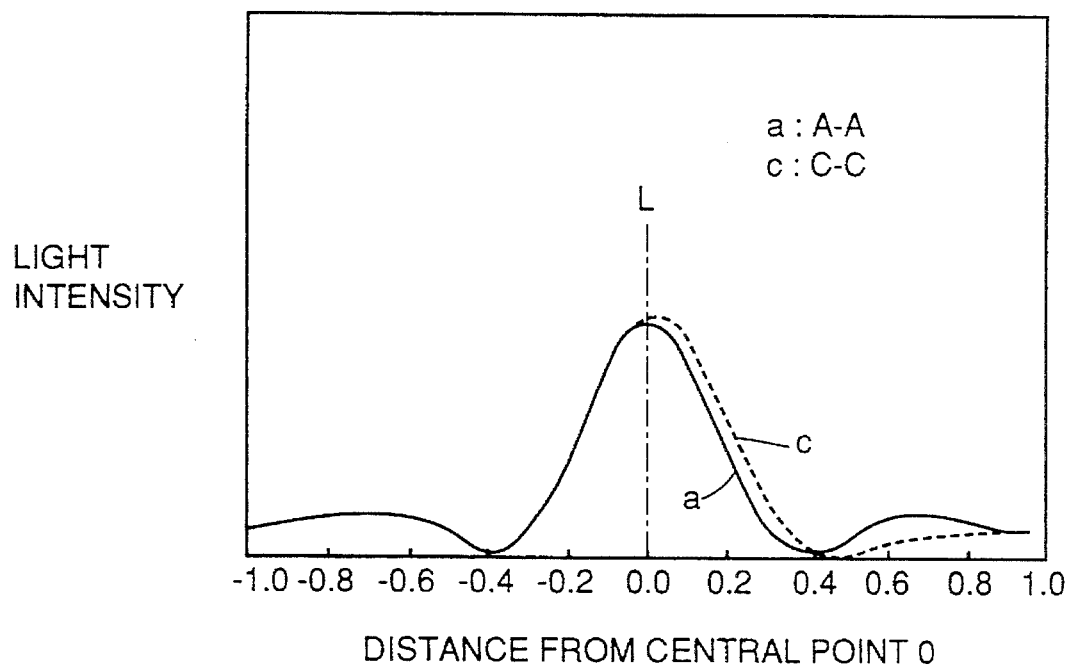
FIG. 34 is a first graph showing light intensity profile for use in illustration of a problem in the conventional method for repairing a defect of a phase shift mask.
Figure 35:
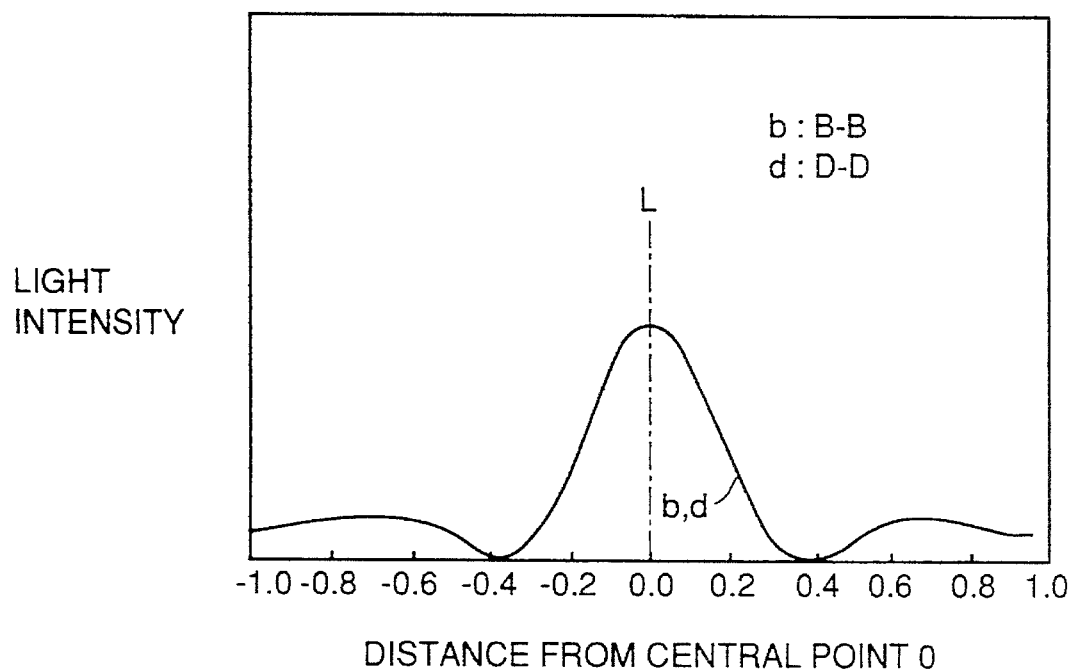
FIG. 35 is a second graph showing light intensity profile for use in illustration of a problem of the conventional method for repairing of defect of a phase shift mask.
Figure 36:
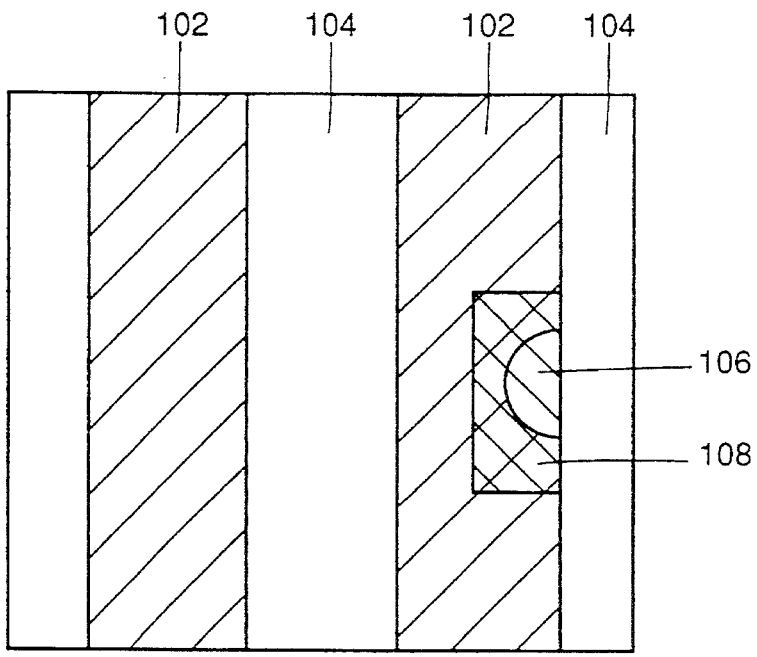
FIG. 36 is a fifth plan view showing a problem of the conventional method for repairing a defect of a phase shift mask.
Figure 37:
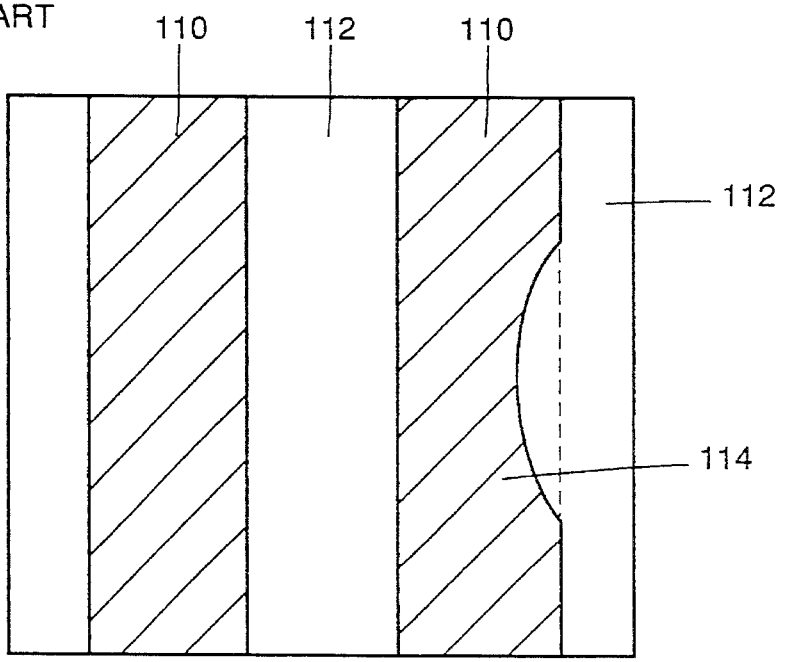
FIG. 37 is a sixth plan view showing a problem in the conventional method for repairing a defect of a phase shift mask.

In FIG. 23, a size (x) of defective pattern 23 shown in FIG. 22(a) is plotted along an abscissa, and a distance (h) between mask pattern 21 and defective pattern 23 is plotted along an ordinate.

It is understood that the profile shown by a dotted line in FIG. 22(b) represents an optical profile (solid line a) of the mask pattern being shifted toward the defective pattern side based on the relationship between the size of defective pattern 23 and the distance h between mask pattern and defective pattern. In order to obtain the light intensity profile of a desired mask pattern, such a shifting amount has to be about 10% or less.

FIG. 23 is a graph showing whether or not the defective pattern has to be repaired such that the shifting amount is 10% or less, wherein a region indicated by A is a region where it is unnecessary to repair the defective pattern in the conventional example; a region indicated by B is a region where the defective pattern has to be repaired in the conventional example and can be repaired by the conventional method; and a region indicated by C is a region where the repair was impossible in the conventional example, but is now possible by the above respective embodiments. Thus, even if the size of defect is 1.5 µm and the distance between the defective pattern and the mask pattern is 0.25 µm, for example, the phase shift mask can be repaired, whereby the yield can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask, comprising:

a light transmitting portion exposing a surface of a transparent substrate; and a phase shifter portion formed on said transparent substrate, having a smaller transmittance of exposure light than that of said light transmitting portion and converting a phase of exposure light by 180°, wherein a phase shifter defective portion in which a portion of said phase shifter portion is missing is provided in a region including a boundary between said light transmitting portion and said phase shifter portion, and a repairing member having substantially the same transmittance and phase angle as those of said phase shifter portion is provided in said phase shifter defective portion.

2. The phase shift mask according to claim 1, wherein a phase angle of said repairing member is 120°–240°.

3. The phase shift mask according to claim 1, wherein a transmittance of said repairing member is 4%–15%.

4. The phase shift mask according to claim 1, wherein said repairing member is made of the same material as that of said phase shifter portion.

5. The phase shift mask according to claim 1, wherein said repairing member is made of a kind of material selected from the group consisting of a metal oxide, a metal nitride oxide, a metal silicide oxide, and a nitride oxide of metal silicide.

6. The phase shift mask according to claim 1, wherein said repairing member is made of a kind of material selected from the group comprising a carbon, a chromium oxide, a chromium nitride oxide, a chromium nitride carbide oxide, a molybdenum silicide oxide, and a nitride oxide of molybdenum silicide.

7. The phase shift mask according to claim 1, wherein said repairing member includes a first repairing film having substantially the same transmittance as that of said phase shifter portion and a second repairing film having substantially the same phase angle as that of said phase shifter portion.

8. A phase shift mask, comprising:

a light transmitting portion exposing a surface of a transparent substrate; and a phase shifter portion formed on said transparent substrate, having a smaller transmittance of exposure light than that of said light transmitting portion, and converting a phase of exposure light by 180°, wherein a phase shifter defective portion in which a portion of said phase shifter portion is missing is provided in a region including a boundary between said light transmitting portion and said phase shifter portion, and a light shielding film is provided at said phase shifter defective portion and at a region protruding to said light transmitting portion for a predetermined length from a boundary between said light transmitting portion and said phase shifter portion included in said phase shifter defective portion.

9. A method for repairing a defect of a phase shift mask including a light transmitting portion exposing a surface of a transparent substrate, and a phase shifter portion formed on said transparent substrate, having a smaller transmittance of exposure light than that of said light transmitting portion, and converting a phase of exposure light by 180°, comprising the steps of:

detecting a phase shifter defective portion in which a portion of said phase shifter portion is missing in a region including a boundary between said light transmitting portion and said phase shifter portion; and supplementing said phase shifter defective portion with a repairing member having substantially the same transmittance and phase angle as those of said phase shifter defective portion.

10. The method for repairing a defect of a phase shift mask according to claim 9, wherein a phase angle of said repairing member is 120°–240°.

11. The method for repairing a defect of a phase shift mask according to claim 9, wherein said repairing member has a transmittance of 4%–15%.

12. The method for repairing a defect of a phase shift mask according to claim 9, wherein said repairing member is supplemented to said phase shifter defective portion after repairing a defective shape of said phase shifter defective portion into a predetermined shape.

13. The method for repairing a defect of a phase shift mask according to claim 9, wherein said step of supplementing of said repairing member includes forming a first repairing film having substantially the same transmittance as that of said phase shifter portion, and forming a second repairing film having substantially the same phase angle as that of said phase shifter portion by a focused ion beam method.

14. A method for repairing a defect of a phase shift mask including a light transmitting portion exposing a surface of a transparent substrate, and a phase shifter portion formed on said transparent substrate, having a smaller transmittance of exposure light than that of said light transmitting portion, and converting a phase of exposure light by 180°, comprising the steps of:

detecting a phase shifter defective portion in which a portion of said phase shifter portion is missing in a region including a boundary between said light transmitting portion and said phase shifter portion; and forming a light shielding film at said phase shifter defective portion and at a region protruding to said light transmitting portion for a predetermined length from a boundary between said light transmitting portion and said phase shifter portion included in said phase shifter defective portion.

15. A method for repairing a defect of a phase shift mask, comprising the steps of:

forming on a transparent substrate a phase shift pattern including a light transmitting portion exposing a surface of said transparent substrate, and a phase shifter portion having a smaller transmittance of exposure light than that of said light transmitting portion and converting a phase of exposure light by 180°;

forming a resist film on the entire surface of said phase shift pattern;

removing said resist film formed on and in the vicinity of a region including a boundary between said light transmitting portion and said phase shifter portion in a phase shifter defective portion in which a portion of said phase shifter portion is missing;

forming on said phase shift pattern a repairing film having substantially the same transmittance and phase angle as those of said phase shifter portion; and removing said resist film by etching for leaving said repairing film in a region of said phase shifter defective portion.

* * * * *